United States Patent
Shaikh et al.

(10) Patent No.: US 11,674,226 B2
(45) Date of Patent: Jun. 13, 2023

(54) SEPARATION OF PLASMA SUPPRESSION AND WAFER EDGE TO IMPROVE EDGE FILM THICKNESS UNIFORMITY

(71) Applicant: Lam Research Corporation, Fremont, CA (US)

(72) Inventors: Fayaz Shaikh, Portland, OR (US); Taide Tan, Tigard, OR (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 16/803,313

(22) Filed: Feb. 27, 2020

(65) Prior Publication Data
US 2020/0190667 A1    Jun. 18, 2020

Related U.S. Application Data

(62) Division of application No. 14/788,621, filed on Jun. 30, 2015, now abandoned.

(51) Int. Cl.
*C23C 16/455* (2006.01)
*H01J 37/32* (2006.01)
(Continued)

(52) U.S. Cl.
CPC .... *C23C 16/45565* (2013.01); *C23C 16/4585* (2013.01); *C23C 16/5096* (2013.01);
(Continued)

(58) Field of Classification Search
CPC ........... H01J 37/32082; H01J 37/32623; H01J 37/32642; H01J 37/32715; H01J 2237/20;
(Continued)

(56) References Cited

U.S. PATENT DOCUMENTS

| 5,275,683 A | 1/1994 | Arami et al. |
| 5,440,707 A | 8/1995 | Hayes et al. |
| (Continued) |

FOREIGN PATENT DOCUMENTS

| JP | H0644138 U | 6/1994 |
| JP | H08339984 A | 12/1996 |
| (Continued) |

OTHER PUBLICATIONS

JP Office Action dated Aug. 11, 2020, in Application No. JP2016-116779 with English translation.
(Continued)

*Primary Examiner* — Charlee J. C. Bennett
(74) *Attorney, Agent, or Firm* — Weaver Austin Villeneuve & Sampson LLP

(57) ABSTRACT

A chamber for use in implementing a deposition process includes a pedestal for supporting a semiconductor wafer. A silicon ring is disposed over the pedestal and surrounds the semiconductor wafer. The silicon ring has a ring thickness that approximates a semiconductor wafer thickness. The silicon ring has an annular width that extends a process zone defined over the semiconductor wafer to an extended process zone that is defined over the semiconductor wafer and the silicon ring. A confinement ring defined from a dielectric material is disposed over the pedestal and surrounds the silicon ring. A showerhead having a central showerhead area and an extended showerhead area is also included. The central showerhead area is substantially disposed over the semiconductor wafer and the silicon ring. The extended showerhead area is substantially disposed over the confinement ring. The annular width of the silicon ring enlarges a surface area of the semiconductor wafer that is exposed and shifts non-uniformity effects of deposition materials over the
(Continued)

semiconductor wafer from an edge of the semiconductor wafer to an outer edge of the silicon ring.

17 Claims, 8 Drawing Sheets

(51) Int. Cl.
    *C23C 16/458* (2006.01)
    *C23C 16/509* (2006.01)

(52) U.S. Cl.
    CPC .. *H01J 37/32082* (2013.01); *H01J 37/32623* (2013.01); *H01J 37/32642* (2013.01); *H01J 37/32715* (2013.01); *H01J 2237/20* (2013.01); *H01J 2237/332* (2013.01)

(58) Field of Classification Search
    CPC ......... H01J 2237/332; C23C 16/45565; C23C 16/4585; C23C 16/5096
    USPC .................................................... 156/345.34
    See application file for complete search history.

(56) References Cited

U.S. PATENT DOCUMENTS

| | | | |
|---|---|---|---|
| 5,529,657 A | 6/1996 | Ishii | |
| 5,556,500 A | 9/1996 | Hasegawa et al. | |
| 5,560,776 A | 10/1996 | Sugai et al. | |
| 5,656,093 A | 8/1997 | Burkhart et al. | |
| 9,428,833 B1 * | 8/2016 | Duvall | C23C 16/4409 |
| 2001/0019881 A1 | 9/2001 | Ohmoto et al. | |
| 2002/0038691 A1 * | 4/2002 | Hayakawa | H01J 37/32642 |
| | | | 156/345.46 |
| 2003/0217693 A1 * | 11/2003 | Rattner | H01L 21/68785 |
| | | | 118/500 |
| 2004/0134618 A1 * | 7/2004 | Endoh | H01J 37/32642 |
| | | | 156/345.51 |
| 2004/0241995 A1 | 12/2004 | Yamanaka | |
| 2005/0005859 A1 | 1/2005 | Koshiishi et al. | |
| 2005/0133164 A1 | 6/2005 | Fischer et al. | |
| 2006/0000803 A1 | 1/2006 | Koshiishi et al. | |
| 2006/0151116 A1 | 7/2006 | Wu | |
| 2007/0128871 A1 | 6/2007 | Yamanaka | |
| 2007/0218664 A1 * | 9/2007 | Ito | C23C 16/4586 |
| | | | 438/565 |
| 2008/0023145 A1 | 1/2008 | Ohmoto et al. | |
| 2008/0236748 A1 | 10/2008 | Kobayashi et al. | |
| 2009/0095221 A1 * | 4/2009 | Tam | C23C 16/34 |
| | | | 118/715 |
| 2009/0311430 A1 * | 12/2009 | Ito | C23C 16/4586 |
| | | | 427/314 |
| 2010/0040768 A1 | 2/2010 | Dhindsa | |
| 2011/0031111 A1 | 2/2011 | Kobayashi | |
| 2011/0139371 A1 * | 6/2011 | Lee | H01J 37/3244 |
| | | | 156/345.33 |
| 2011/0146571 A1 * | 6/2011 | Bartlett | C23C 16/45572 |
| | | | 118/667 |
| 2013/0008608 A1 | 1/2013 | Matsumoto et al. | |
| 2014/0123900 A1 | 5/2014 | Wang et al. | |
| 2015/0107772 A1 * | 4/2015 | Uchida | H01J 37/3244 |
| | | | 156/345.33 |
| 2016/0133781 A1 * | 5/2016 | Thirunavukarasu | |
| | | | H01L 33/0066 |
| | | | 438/478 |
| 2017/0287764 A1 | 10/2017 | Kouno et al. | |
| 2018/0122633 A1 * | 5/2018 | Leeser | H01L 21/68771 |

FOREIGN PATENT DOCUMENTS

| | | | | |
|---|---|---|---|---|
| JP | 2593282 Y2 | | 4/1999 | |
| JP | 2001308079 A | | 11/2001 | |
| JP | 2001319920 A | | 11/2001 | |
| JP | 2003229408 A | | 8/2003 | |
| JP | 2004311972 A | | 11/2004 | |
| JP | 2007109770 A | | 4/2007 | |
| JP | 2007515081 A | | 6/2007 | |
| JP | 2010251723 A | | 11/2010 | |
| JP | 2013239482 A | * | 11/2013 | ....... C23C 16/45563 |
| JP | 2014222786 A | | 11/2014 | |
| JP | 6044138 B2 | | 12/2016 | |
| KR | 100274768 B1 | | 1/2001 | |
| KR | 20010087219 A | | 9/2001 | |
| KR | 20040063825 A | | 7/2004 | |
| KR | 20070095198 A | | 9/2007 | |
| KR | 20110045005 A | | 5/2011 | |
| KR | 20150018773 A | | 2/2015 | |
| WO | WO-2010019196 A2 | | 2/2010 | |

OTHER PUBLICATIONS

KR Office Action dated May 17, 2022, in Application No. KR10-2016-0072266 with English translation.
TW Office Action dated Dec. 12, 2019, in Application No. TW105118317 with English translation.
TW Office Action dated May 18, 2020, in Application No. TW105118317 with English translation.
U.S. Advisory Action dated Oct. 11, 2019, in U.S. Appl. No. 14/788,621.
U.S. Final Office Action dated Jul. 12, 2018, in U.S. Appl. No. 14/788,621.
U.S. Final Office Action dated Jun. 26, 2019, in U.S. Appl. No. 14/788,621.
U.S. Non-Final office Action dated Dec. 29, 2017 in U.S. Appl. No. 14/788,621.
U.S. Non-Final Office Action dated Jan. 10, 2019, in U.S. Appl. No. 14/788,621.
U.S. Non-Final office Action dated Nov. 27, 2019 in U.S. Appl. No. 14/788,621.
U.S. Restriction Requirement dated Oct. 6, 2017 in U.S. Appl. No. 14/788,621.
KR Office Action dated Jan. 19, 2023 in Application No. KR10-2016-0072266 with English translation.

* cited by examiner

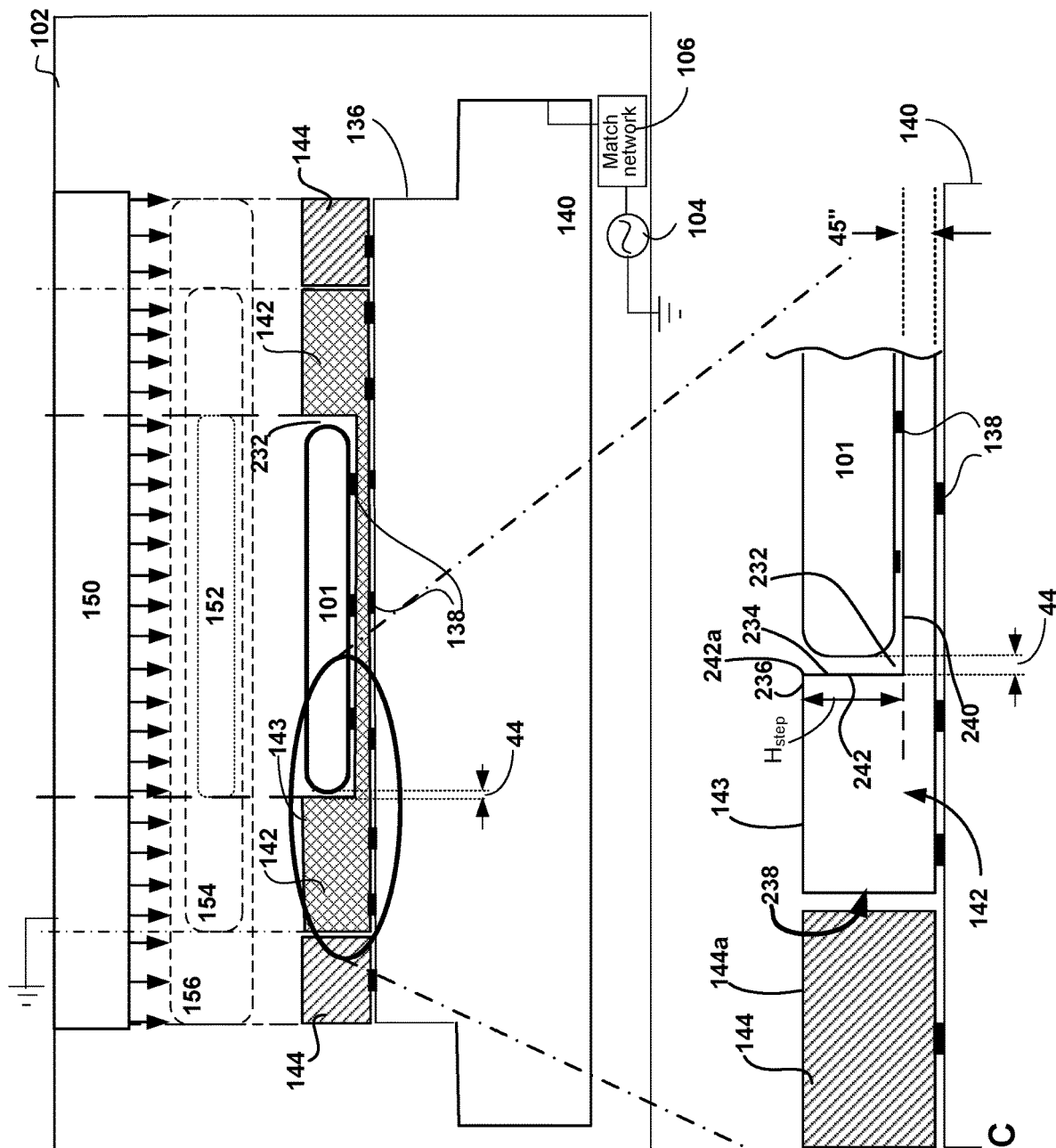

SEPARATION OF PLASMA SUPPRESSION AND WAFER EDGE TO IMPROVE EDGE FILM THICKNESS UNIFORMITY

CLAIM OF PRIORITY

The present patent application is a divisional of U.S. patent application Ser. No. 14/788,621, filed on Jun. 30, 2015, and titled, "Separation of Plasma Suppression and Wafer Edge to Improve Edge Film Thickness Uniformity," which is incorporated herein by reference in its entirety for all purposes.

BACKGROUND

1. Field of the Invention

The present embodiments relate to semiconductor wafer processing equipment tool, and more particularly, to a chamber used in the deposition process.

2. Description of the Related Art

Plasma-enhanced chemical vapor deposition (PECVD) is a type of plasma deposition that is used to deposit thin films of deposition chemistry on a substrate, such as a semiconductor wafer. To enable application of vapor chemistry, PECVD systems include a vaporizer to convert a deposition chemistry in liquid form to vapor form in a controlled manner and deliver the vapor form of the deposition chemistry to a plasma chamber during deposition process. When applied on a surface of the semiconductor wafer (or simply referred to as the "wafer"), the vapor state of the deposition chemistry is converted to a solid state. Chambers used for PECVD include wafer-receiving mechanisms, such as ceramic pedestals, etc., for supporting the semiconductor wafer during processing. The ceramic pedestals are used as they have the ability to withstand the high temperatures that exist within the plasma processing chambers during a deposition process.

To improve per wafer yield of a semiconductor product defined in the wafer, uniformity of deposited films has to be improved. One way of improving film uniformity is by using an effective plasma confinement technique. Some examples of confinement techniques that have been known to effectively confine a plasma generated within the chamber include use of confinement rings made of dielectric materials, termination of electrodes, use of shadow rings, etc. Usage of such confinement techniques has shown a detectable improvement in the uniformity of film in some areas of the wafer (e.g., areas covering the center of the wafer) while other areas continue to experience non-uniformity. One of the main areas of the wafer where non-uniformity of film thickness is exhibited more often is at the edge of the wafer. This may be attributed to the fact that the aforementioned or any other plasma confinement techniques used have been engineered so that the plasma confinement coincides with the wafer edge. At the wafer edge, the film thickness varies due to the wafer, the electrode, and other parts of the reactor chamber interacting with the plasma. A need therefore exists to address some of these drawbacks to improve film thickness uniformity over the surface of the wafer, including the wafer edge.

It is in this context that embodiments of the invention arise.

SUMMARY

Embodiments of the invention define a process chamber that employs a wafer-receiving mechanism, such as a pedestal, for supporting a semiconductor wafer during deposition process. In one implementation, the pedestal is configured to receive and hold a semiconductor wafer and a silicon ring. The silicon ring disposed over the pedestal surrounds the semiconductor wafer, when present. A top surface of the pedestal includes support structures for supporting the wafer and the silicon ring. The silicon ring is made of a material that exhibits similar electrical properties as the semiconductor wafer and is designed to extend a deposition surface from a surface of the semiconductor wafer to a surface of the silicon ring. A confinement ring may be disposed over the pedestal to surround the silicon ring. The confinement ring, when present, is used to confine a plasma at an outer edge of the silicon ring. The silicon ring acts like a continuation of the semiconductor wafer surface and is designed to receive the deposition.

In addition to the pedestal, the process chamber includes a showerhead that is sized to cover at least the surface of the pedestal on which the wafer and the silicon ring are disposed. The presence of the silicon ring adjacent to the semiconductor wafer and the extended upper electrode engineers the plasma confinement (i.e., suppression or termination) to extend to an outer edge of the silicon ring instead of the semiconductor wafer edge, thereby causing deposition to continue beyond the wafer edge. The continuation of the deposition beyond the semiconductor wafer edge will cause the deposited film thickness at the semiconductor wafer edge to be substantially as uniform as it is in the center of the wafer surface and results in shifting the non-uniformity effects away from the semiconductor wafer edge to an outer edge of the silicon ring.

The silicon ring, in one embodiment, is made of the same material as the semiconductor wafer, e.g., silicon. However, it should be noted that the ring surrounding the semiconductor wafer may be made of other materials (e.g., silicon-like materials, such as Germanium, Zirconium toughened Alumina (ZTA), etc.) that exhibit similar electrical properties as the semiconductor wafer. In some embodiments, the silicon ring can also have coatings pre-deposited thereon (e.g., one or more coats), so that the coatings simulate the top material layer of the wafer, e.g., on to which a material is being deposited. Engineering the ring (e.g., silicon ring) from such a material allows smoothening of the transition from the semiconductor wafer surface to the silicon ring surface.

In one embodiment, a gap separating the silicon ring and the semiconductor wafer is kept to a minimum so that the smooth transition can be effectuated. For example, the gap is set so that the plasma is not adversely affected by the gap or produce process shift changes in the electrical properties of the deposition surface. Such properties may include one or more of impedance, power, potential, density, combinations thereof, etc. In one embodiment, a width of the silicon ring is defined so as to enlarge a surface area of the semiconductor wafer and shift non-uniformity effects of the depositing film from an edge of the semiconductor wafer to an outer edge of the silicon ring. The gap between the semiconductor wafer edge and an inner edge of the silicon ring depends, in some embodiments, on number of factors, including the geometry of the chamber, the design of the upper electrode and the pedestal (acting as a lower electrode), gap between the upper and the lower electrodes, process parameters within the chamber, such as process pressure, etc., and in some cases, a Debye length of the plasma generated in the chamber. In one configuration, the gap is set to be less than a Debye length of the plasma, which enables extending the deposition surface beyond the wafer edge and allows substantially removal of non-uniformities at and near the wafer edge. Shifting of the non-uniformity effects away from the semiconductor wafer edge provide for improvements in deposited film thickness uniformity at the wafer edge to be substantially as uniform as it is on the wafer away from wafer edge.

In one configuration, the support structures may be provided as bumps or raised surfaces on the pedestal surface. The support structures are used to enhance a precision contact of an under surface of the semiconductor wafer with the support structures. The edge of the support structures that come in contact with the under surface of the wafer provide minimum contact areas (MCAs) that enable the wafer to be received and held in place during the deposition process.

In one embodiment, a chamber for processing a semiconductor wafer, is disclosed. The chamber includes a pedestal for supporting a semiconductor wafer during a deposition process. A silicon ring surrounds the semiconductor wafer, when present, and is disposed over the pedestal. The silicon ring has a ring thickness that approximates a semiconductor wafer thickness. The silicon ring has an annular width that extends a process zone defined over the semiconductor wafer to an extended process zone that is defined to be over both the semiconductor wafer and the silicon ring. A confinement ring is disposed on the pedestal and surrounds the silicon ring. The confinement ring is defined from a dielectric material. The chamber also includes a showerhead. The showerhead includes a central showerhead area and an extended showerhead area. The central showerhead area is substantially disposed over the semiconductor wafer and the silicon ring. The extended showerhead area is substantially disposed over the confinement ring. The annular width of the silicon ring enlarges a surface area of the semiconductor wafer that is exposed to the extended process zone, and shifts the non-uniformity effects of deposition materials over the semiconductor wafer from an edge of the semiconductor wafer to an outer edge of the silicon ring.

In one embodiment, the semiconductor wafer has a diameter of about 300 mm and the silicon ring extends to a diameter of about 450 mm. The afore-mentioned dimensions are examples and should not be considered limiting.

In one embodiment, a top surface of the pedestal includes a first region with first minimum contact areas (MCAs) for supporting the semiconductor wafer, a second region with second MCAs for supporting the silicon ring, and a third region with third MCAs for supporting the confinement ring.

In one embodiment, the silicon ring exhibits electrical properties that are similar to the semiconductor wafer.

In one embodiment, the silicon ring is disposed over the pedestal such that an inner edge of the silicon ring is adjacent to an outer edge of the semiconductor wafer.

In one embodiment, the pedestal is connected to a radio frequency power (RF) source through a match network and the showerhead is electrically grounded. The RF power source provides power to generate a plasma within the chamber.

In another embodiment, the showerhead is connected to a radio frequency power (RF) source through a match network and the pedestal is electrically grounded. The RF power source provides power to generate a plasma within the chamber.

In one embodiment, the silicon ring disposed on the pedestal defines a gap between an outer edge of the semiconductor wafer and an inner edge of the silicon ring.

In one embodiment, the silicon ring includes a step. The step is defined by a top surface, a sidewall, and a bottom surface. The bottom surface is configured to support the semiconductor wafer during transition from one processing station to another processing station within the chamber. A height of the sidewall of the step approximates the semiconductor wafer thickness.

In one embodiment, a chamber for processing a semiconductor wafer, is disclosed. The chamber is used for performing deposition of a material over a surface of the semiconductor wafer. The chamber includes a carrier wafer that includes an annular ring surface and a pocket defined thereon. The pocket is defined at a center of the carrier wafer. A step is defined in the pocket. The annular ring surface is defined to surround the pocket and extend from an outer edge of the carrier wafer to a top edge of the step. A bottom surface of the step is used to support the semiconductor wafer. A height of the step approximates a semiconductor wafer thickness. The carrier wafer extends a process zone that is defined over the semiconductor wafer to an extended process zone that is defined to be over both the annular ring surface and the pocket of the carrier wafer. The chamber includes a pedestal on which the carrier wafer is supported. A confinement ring defined from a dielectric material is disposed on the pedestal and surrounds the carrier wafer. The chamber also includes a showerhead. The showerhead has a central showerhead area and an extended showerhead area. The central showerhead area is substantially disposed over the carrier wafer and the extended showerhead area is substantially disposed over the confinement ring. The annular ring surface of the carrier wafer enlarges a surface area of the semiconductor wafer that is exposed to the extended process zone and shifts non-uniformity effects of deposition materials over the semiconductor wafer from an edge of the semiconductor wafer to the outer edge of the carrier wafer.

In one embodiment, a top surface of the pedestal includes a first region with first minimum contact areas (MCAs) for supporting the carrier wafer and a second region with second MCAs for supporting the confinement ring.

In one embodiment, the bottom surface of the pocket includes MCAs for supporting the semiconductor wafer.

Embodiments of the disclosure provide ways to direct the plasma suppression away from the semiconductor wafer edge to an outer edge of a silicon ring. The silicon ring disposed adjacent to the semiconductor wafer allows the deposition to continue on to the surface of the silicon ring as if the silicon ring is part of the semiconductor wafer. The composition and design of the silicon ring makes it possible for the plasma to see minimal change in the deposition surface. The showerhead is sized to extend beyond a process zone defined over the wafer edge to an extended process zone defined over both the semiconductor wafer and the silicon ring. This provides substantial improvement in the film deposition uniformity at the wafer edge.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings.

FIGS. 3A-1 and 3A-2 illustrate simplified block diagrams of a side view of a pedestal used within a deposition chamber, in alternate embodiments of the invention.

FIG. 3B illustrates a simplified block diagram of a side view of carrier wafer supported on a pedestal, in one embodiment of the invention.

FIG. 3C illustrates an explosive view of a portion of the carrier wafer illustrated in FIG. 3B, in one embodiment of the invention.

DESCRIPTION

Figure 1:
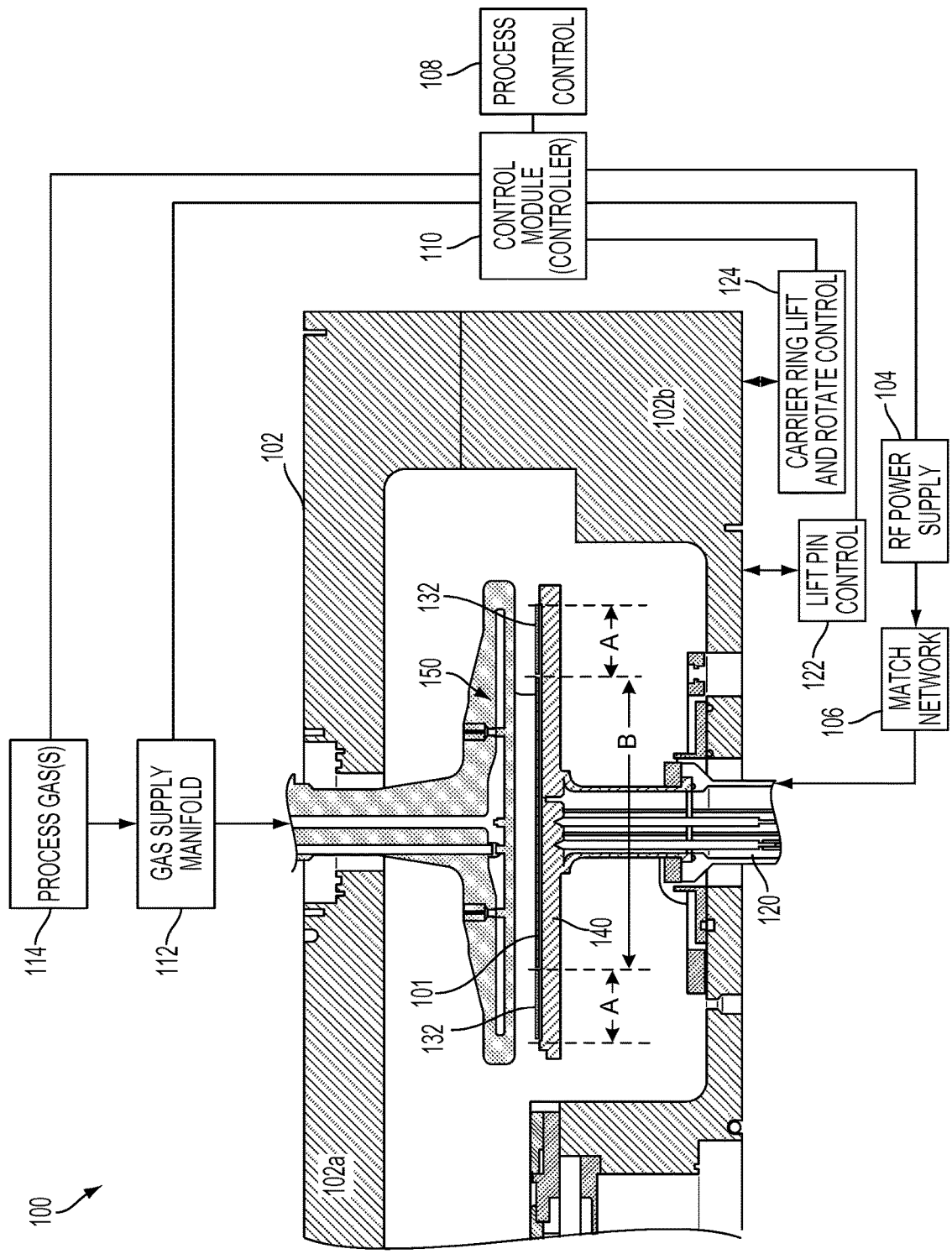
FIG. 1 illustrates an example wafer processing system used to process a semiconductor wafer, e.g., to form films thereon, in one embodiment of the invention.

Embodiments of the disclosure define a pedestal and a showerhead that are used within a deposition chamber (e.g., reactor) for processing semiconductor wafers. In one implementation, the chamber includes a pedestal for supporting a semiconductor wafer and a silicon ring. The silicon ring surrounds the semiconductor wafer and acts to enlarge a surface area of the semiconductor wafer so as to shift non-uniformity effects of the deposition materials away from a wafer edge to an outer edge of the silicon ring. Optionally, the chamber includes a confinement ring. The confinement ring is received on the pedestal and is designed to surround the silicon ring such that an inner edge of the confinement ring is adjacent to an outer edge of the silicon ring. In one implementation, support structures in the form of bumps or raised surfaces may be provided on a top surface of the pedestal for supporting the wafer and the silicon ring on the pedestal. In the embodiments where a confinement ring is present, the pedestal includes support structures to support the confinement ring. The process chamber also includes an upper electrode, in the form of a showerhead. The showerhead includes a central showerhead area that substantially covers a region over the semiconductor wafer and the silicon ring, and in some embodiments, an extended showerhead area that substantially covers a region over the confinement ring. The showerhead provides gas chemistries for generating a plasma within the chamber, and in specific embodiments, depositing materials.

In one example configuration, the silicon ring is made of same material (e.g., silicon) as the semiconductor wafer (or simply referred to as "wafer"), and exhibits substantially similar electrical properties as the wafer. It is to be noted that although, in this example, the silicon ring is used for surrounding the wafer, the embodiments are not limited to the use of the silicon ring. Instead, the ring surrounding the semiconductor wafer may be made of other silicon-like materials (e.g., Germanium (Ge), Zirconium toughened Alumina (ZTA), Yttria-doped (e.g., Yttrium oxide) Alumina, Yttria stabilized Zirconia (YSZ), Sapphire, etc.). Configuring the ring of same or similar type of material as the semiconductor wafer allows the deposition surface to extend beyond the wafer edge. Thus, when plasma is formed during a deposition process, the silicon ring enlarges the deposition surface area beyond the semiconductor wafer surface on to the silicon ring surface and is instrumental in shifting the non-uniformity effects of deposition away from a wafer edge to an outer edge of the silicon ring.

In one embodiment, extension of the deposition surface beyond the wafer edge is enabled so long as the plasma is not substantially disturbed by a gap defined between the wafer edge and the adjacent edge of the silicon ring. In one embodiment, a size of the gap between the semiconductor wafer and the silicon ring is minimized. The size of the gap separating the wafer and the silicon ring can depend on one or more factors, such as geometry of the chamber, geometry of the showerhead and the pedestal, gap between the showerhead and the pedestal, process pressure, resulting Debye length of the plasma generated within the chamber, combinations thereof, etc.

In one embodiment, the gap is less than about 1.0 mm, and in another embodiment, it can be less than about 0.5 mm, and in one example, the gap is about 0.25 mm. In still another embodiment, the gap may be less than about 0.25 mm, so long as the deposition does not substantially close the gap.

It should be understood that the aforementioned factors are mere examples and fewer or additional factors may be used to influence selection of the gap between the wafer and the silicon ring.

The extension of the deposition surface, by provisioning the silicon ring or a ring made with similar silicon-like material as the wafer, assists in transitioning plasma non-uniformities from the wafer edge to the outer edge of the silicon ring. Since the silicon ring is not the target or intent of process, non-uniformities at the silicon ring edge are not relevant (e.g., the silicon ring being a replaceable consumable part). In one embodiment, the surface of the silicon ring is configured to exhibit a same or similar electrical properties, such as impedance, power, potential, density, etc., as the wafer. Further, in one embodiment, the gap between the wafer edge and the edge of the silicon ring is defined so as to minimize changes in electrical properties between the wafer and silicon ring. As a result, deposition continues over the silicon ring as though the silicon ring were part of the wafer, thereby shifting the edge effect of the plasma from the wafer edge to the silicon ring edge. For example, the surface of the wafer edge is subjected to deposition thicknesses that are similar to the surface of the wafer that is away from the wafer edge. Improving edge deposition uniformity therefore acts to improve wafer yield.

It should be appreciated that the present embodiments can be implemented in numerous ways, such as a process, an apparatus, a system, a device, or a method. Several embodiments are described below.

Deposition of films is preferably implemented in a plasma enhanced chemical vapor deposition (PECVD) system. The PECVD system may take many different forms. For example, the PECVD system includes one or more chambers or "reactors" (sometimes including multiple stations) that each house one or more wafers and are suitable for wafer processing. The one or more chambers maintain the wafer in a defined position or positions (with or without motion within that position, e.g. rotation, vibration, or other agitation). A wafer undergoing deposition may be transferred from one station to another within a reactor chamber during the process. The film deposition may occur entirely at a single station or any fraction of the film may be deposited at any number of stations. Although the various embodiments are described with reference to the use of PECVD systems to implement the deposition of films, the embodiments are not restricted to PECVD systems but can be extended to atomic layer deposition (ALD) systems, or even etch systems.

During a deposition process, each wafer is held in place within a deposition chamber by a pedestal, a wafer chuck or other wafer-receiving mechanism disposed within the chamber. The wafer-receiving mechanism, e.g., pedestal, may include a plurality of support structures that are distributed across a top surface. In one embodiment, the support structures are bumps defined on the top surface of the wafer-receiving mechanism, such as the pedestal. The support structures define minimal contact areas (MCAs) and are operative to support the wafer during deposition process by enhancing precision contact (especially with higher tolerances) of the support structures with an underside surface of the semiconductor wafer. For certain operations, the wafer-receiving mechanism, in some embodiments, may also include a heater such as a heating plate to heat the wafer.

FIG. 1 illustrates a wafer processing system 100, which is used to process a wafer 101, in one embodiment. The system 100 includes a chamber 102 having a lower chamber portion 102b and an upper chamber portion 102a. A center column in the lower chamber portion 102b is configured to support a wafer-receiving mechanism, such as a pedestal 140, which in one embodiment is a powered electrode. The pedestal 140, in this embodiment, is electrically coupled to power supply 104 (e.g., RF power supply) via a match network 106. The upper chamber portion 102a houses a showerhead 150 which, in this embodiment, is electrically grounded (as will be explained with reference to FIG. 3A-2). In another embodiment, the wafer-receiving mechanism (i.e., pedestal 140) in the lower chamber portion 102b is electrically grounded (as will be explained with reference to FIG. 3A-1). In this embodiment, the showerhead 150 in the upper chamber portion 102a is electrically coupled to power supply 104 via the match network 106. The showerhead 150, as noted above, supplies gas chemistries for generating a plasma. The power supply is used to generate the plasma within the chamber and is controlled by a control module 110, e.g., a controller. The control module 110 is configured to operate the wafer processing system 100 by executing process input and control module 108. The process input and control module 108 may be used to control process recipes, such as power levels, timing parameters, process gasses, mechanical movement of the wafer 101, etc., for depositing or forming films over the wafer 101.

The center column in the lower chamber 102b includes a lifting mechanism to receive, hold and raise the wafer from the pedestal 140. In one embodiment, the lifting mechanism includes lift pins 120, which are controlled by a lift pin control 122. The lift pin control 122 operates to control the lift pins 120 to raise the wafer 101 from the pedestal 140 when the wafer 101 has to be removed, and to receive, lower and hold the wafer 101 when the wafer 101 is moved into the process chamber 102 by an end-effector. A silicon ring lift and rotate control module 124 may be used to control the lifting of the wafer 101 from the pedestal 140 and moving the wafer to a different processing station within the same chamber or a different chamber. In one embodiment, the silicon ring lift and rotate control module 124 may be used to manipulate a moving mechanism, such as a fork lift mechanism, that is used to move the wafer from a pedestal 140 (i.e., wafer-receiving mechanism) of one processing station to a wafer-receiving mechanism of a different processing station.

A gas supply manifold 112 connected to process gas supply module 114, e.g., a gas chemistry reservoir that maintains the gas chemistry supplied from a facility, is operatively connected to the wafer processing system 100. Depending on the processing being performed, the control module 110 is operative to control the delivery of process gas(es) (i.e., gas chemistries) via the gas supply manifold 112. The chosen gas(es) flow into the showerhead 150 and are distributed in a space volume defined between a face of the showerhead 150 that faces the semiconductor wafer 101 and a top surface of the wafer 101 resting over the pedestal 140. The showerhead 150 is part of the upper electrode.

When more than one process gas is used, the process gases may be premixed or kept distinct. When kept distinct, the process gases may be supplied in a pre-defined sequence. Appropriate valves and mass flow control mechanisms may be employed to ensure that the correct process gases are delivered during the deposition and plasma treatment phases of the process. Process gases exit chamber via an outlet (not shown). A vacuum pump may be employed to draw process gases out of the chamber so as to maintain a suitable pressure within the chamber. The vacuum pump may be operated by a close loop controlled flow restriction device, such as a throttle valve or a pendulum valve (not shown).

In one embodiment, a surface of the pedestal 140 disposed in the lower chamber portion 102b is designed to be large enough to accommodate at least the semiconductor wafer 101 and a silicon ring 132. The surface of the pedestal 140, in this embodiment, includes a distinct wafer support region (represented by reference letter 'B' in FIG. 1) that supports the semiconductor wafer 101 during deposition process, and a carrier support region (represented by reference letter 'A') surrounding the wafer support region ('B'). The carrier support region ('A') is defined to cover an area of the pedestal 140 that is immediately adjacent to and surrounding the wafer support region that is defined in the center. A silicon ring 132 is disposed on the carrier support region of the pedestal 140 so as to encircle the semiconductor wafer 101, when present. In some embodiments, the silicon ring 132 is made of the same material as the semiconductor wafer 101 (e.g., silicon). In other embodiments, the silicon ring 132 is made of silicon-like material (e.g., Germanium, Zirconium toughened Alumina (ZTA), Yttria-doped Alumina, Yttria stabilized Zirconia (YSZ), Sapphire, etc.). Due to the similarity in the material used in the silicon ring 132 and the wafer 101, the silicon ring 132 exhibits substantially similar electrical properties as the wafer 101 that is disposed on the wafer support region.

In one embodiment, the silicon ring 132 (or silicon-like ring) acts to extend the deposition beyond the edge of the wafer 101 and allows for a smooth transition of the deposition surface, for the plasma, from the wafer surface to the silicon ring surface. In one embodiment, a gap defined between the wafer and the silicon ring disposed on the pedestal is set so as to not substantially disturb the plasma, thereby enabling a smooth transition of the plasma.

In one embodiment, in addition to the wafer support region and the carrier support region, the pedestal surface may also include a confinement region (not shown) on which a confinement ring (not shown) is disposed. The confinement region is defined to surround the carrier support region. The confinement ring received on the confinement region of the pedestal 140 is annular in shape and surrounds the silicon ring 132 such that an outer edge of the silicon ring 132 received on the pedestal 140 is adjacent to an inner edge of the confinement ring. The confinement ring, in one embodiment, is made of a dielectric material. The confinement ring is configured to assist in confining the plasma generated within the chamber 102 to about the outer edge of the silicon ring 132.

Figure 2A:
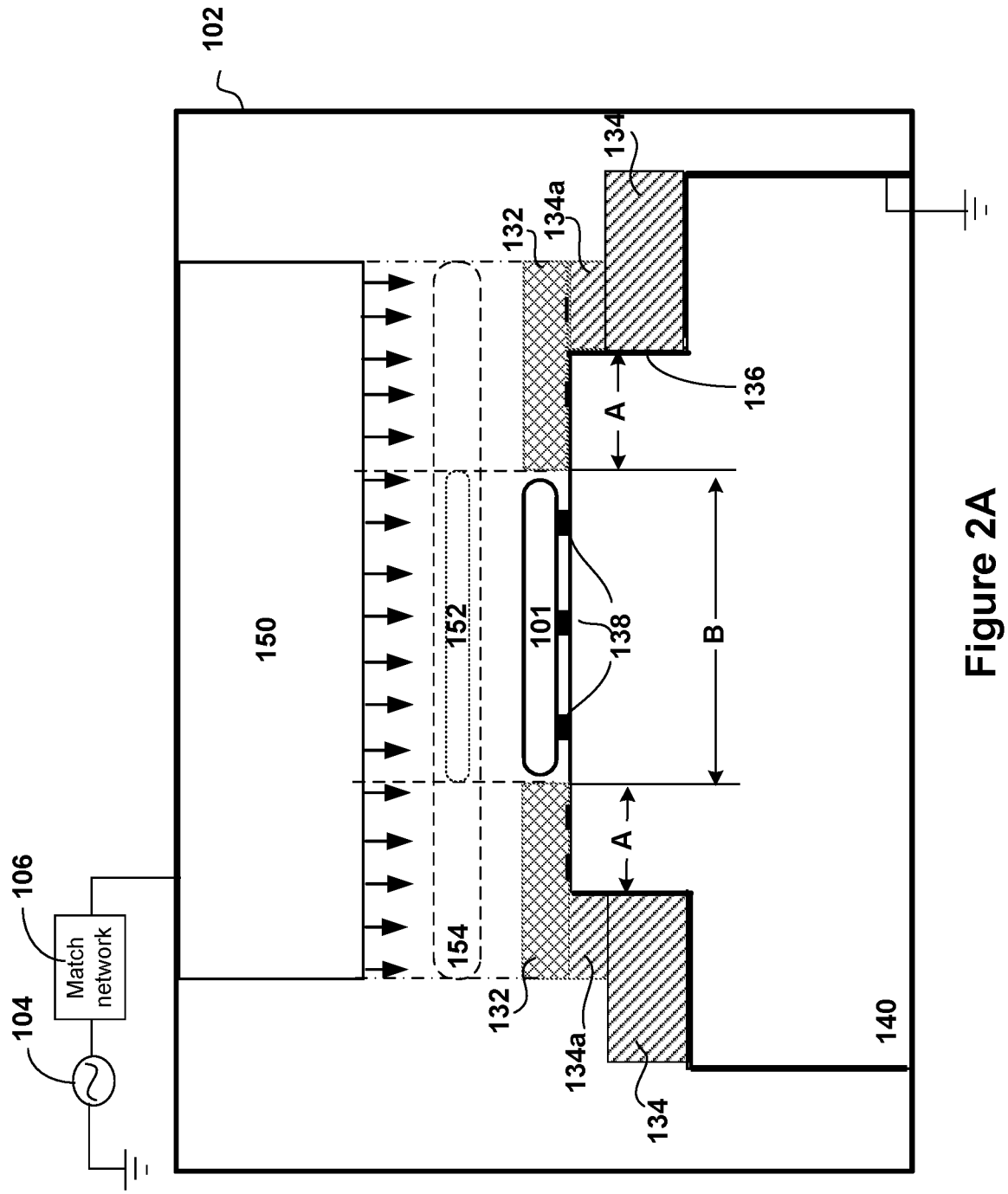
FIG. 2A illustrates simplified block diagram of a side view of a pedestal employed in the deposition chamber of FIG. 1, in one embodiment of the invention.

FIG. 2A illustrates a simplified block diagram of a side view of an example processing system with a chamber 102 that is used in a deposition process, in one embodiment. The chamber 102 includes a pedestal 140, and a showerhead 150 that are designed to extend the deposition surface beyond the semiconductor wafer surface to a silicon ring surface. The structure of the pedestal 140 is similar to the one illustrated in FIG. 1, and includes a distinct wafer support region (identified by reference letter 'B') for receiving and holding the wafer 101 and a carrier support region (identified by reference letter 'A') for receiving a silicon ring 132. The wafer support region, in one embodiment, includes a plurality of support structures 138 that are operatively configured to receive and hold the wafer 101 during deposition process. As noted above, the silicon ring 132 is annular in shape and is configured to encircle the semiconductor wafer 101. The silicon ring 132 is made of a material that is similar to the wafer material and in one embodiment is designed to be about the same thickness as the wafer 101. In other embodiments, the silicon ring 132 may be thicker than the wafer or thinner than the wafer. The top surface of the wafer 101 and the top surface of the silicon ring 132, in one embodiment, are approximately coplanar.

In one embodiment, the pedestal 140 also includes an insulator block 134 that is made of dielectric or ceramic material. The insulator block 134 is disposed on the pedestal 140 in a region below the silicon ring 132. The region is defined by an outer step that includes an outer step wall 136 and the insulator block 134 is disposed adjacent to the outer step wall 136. The insulator block 134 may be a single block or may include two or more blocks. In the embodiment illustrated in FIG. 2A, the region includes a two-block insulator structure with a second insulator block 134a disposed between the insulator block 134 and the silicon ring 132. In one embodiment, insulator block 134 or insulator block 134a may be made of ceramic, dielectric or any other insulating material that is capable of withstanding process conditions within the chamber 102.

A showerhead 150 disposed in the chamber 102 provides necessary process gases to generate a plasma. The showerhead 150 is designed, in one embodiment, to be large enough to cover at least the surface area of the pedestal 140 that includes the wafer support region and the carrier support region. For example, in one embodiment, the showerhead 150 covers an extended process region 154 that covers not only the process region 152 defined over the wafer 101 but also the region defined over the silicon ring 132. The showerhead 150, in the embodiment illustrated in FIG. 2A, is coupled to a RF power source 104 through a match network 106 and the pedestal 140 is electrically grounded.

Figure 2B:
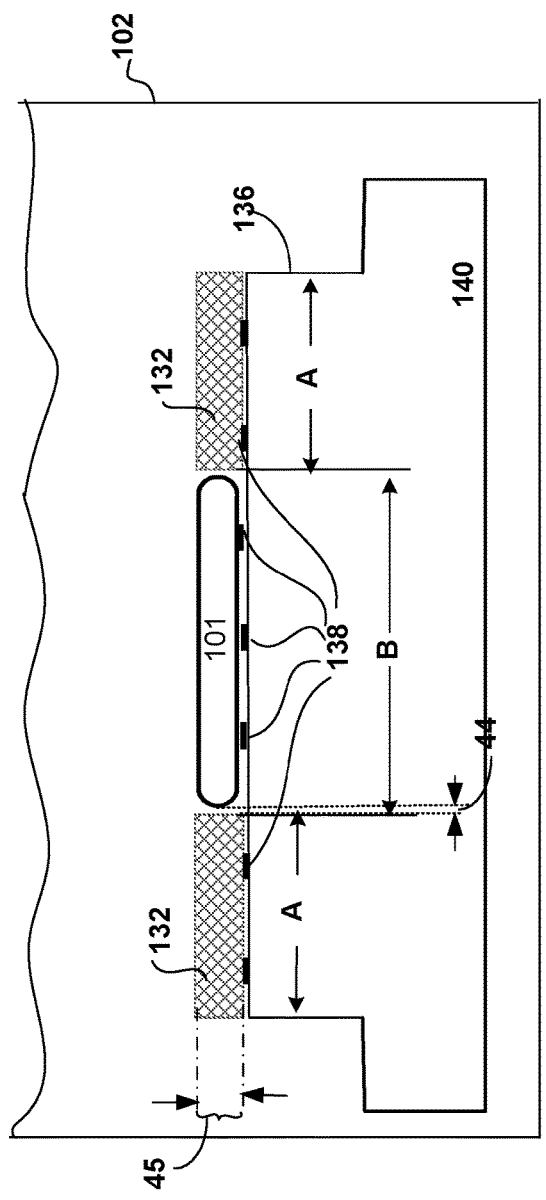
FIGS. 2B and 2C illustrate side views of a pedestal of FIG. 2A, in different embodiments of the invention.

FIG. 2B illustrates a lower portion of the chamber 102 in which a silicon ring 132 is disposed on a pedestal 140, in one embodiment. The structure of the pedestal 140 is similar to the one illustrated in FIG. 2A. The pedestal 140 is designed to include the plurality of support structures 138 disposed across the wafer support region ('B') and the carrier support region ('A') to define the minimal contact areas for receiving and supporting the wafer 101 and the silicon ring 132, during a deposition process. For simplicity sake, an outer step defined by a step wall 136 has been shown without the insulator block 134, whereas in use the insulator block 134 may be disposed by the side of or below the silicon ring in a similar fashion as illustrated and described with reference to FIG. 2A.

A gap 44 defined between the silicon ring 132 and the semiconductor wafer 101 is set to a minimum so as to not adversely affect the plasma. The thickness 45 of the silicon ring 132, in one embodiment, approximates the wafer 101 thickness so that a top surface of the wafer 101 is at about a same level as a top surface of the silicon ring 132. Designing the silicon ring 132 thickness to approximate to the wafer 101 thickness further aids in a smooth transition of the plasma from the wafer surface to the silicon ring surface. In one embodiment, the thickness of the silicon ring 132 is about 1.75 mm. In another example, the thickness of the silicon ring 132 is between about 1.5 mm to about 2 mm. In other embodiments, the silicon ring 132 may be thinner or thicker, so long as the top surface of the silicon ring 132 and the wafer are at least about coplanar. In this example, the gap is identified as gap 44. In one embodiment, the gap 44 is less than about 1.0 mm, and in another embodiment, it can be less than about 0.5 mm, and in one example, the gap is about 0.25 mm. In still another embodiment, the gap can be less than about 0.25 mm, so long as the deposition does not substantially close the gap.

Figure 2C:
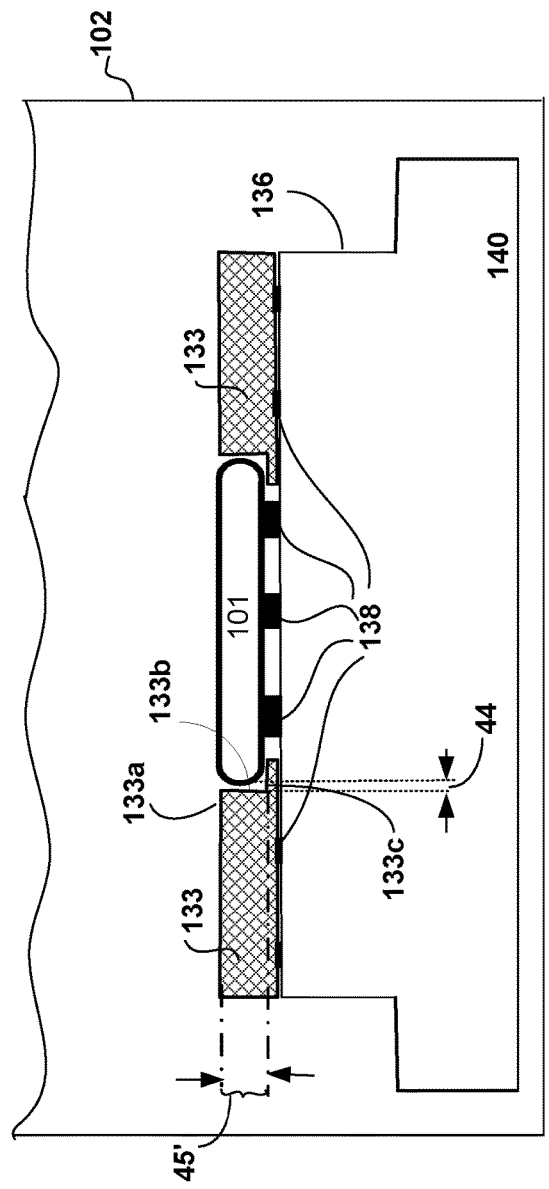

FIG. 2C illustrates an alternate embodiment wherein instead of the silicon ring 132 a silicon carrier ring 133 is disposed on the pedestal 140. The silicon carrier ring 133 is shown to include a shelf defined by a step down. The step is defined by a top surface 133a, a step sidewall 133b and a bottom surface 133c. The pedestal 140 includes support structures 138 for supporting the wafer 101 as well as to hold the silicon carrier ring 133. The bottom surface 133c of the step of the silicon carrier ring 133 is designed to support the wafer 101 when the wafer 101 is to be moved from one processing station to another processing station within the chamber 102. In one embodiment, a height 45' of the sidewall 133b of the step is defined such that the top surface 133a of the silicon carrier ring 133 is at the same level as a top surface of the wafer 101, when the silicon carrier ring 133 is in a disengaged mode. Consequently, in one embodiment, the bottom surface 133c of the step in the silicon carrier ring 133 will not be touching an underside surface of the wafer, when in the disengaged mode but will be positioned to touch the underside surface of the wafer, when in an engaged mode. In the disengaged mode, the wafer 101 is supported on the pedestal 140 by the support structures 138. When the silicon carrier ring 133 is in the engaged mode, the silicon carrier ring 133 is moved to support the wafer 101. The silicon carrier ring 133, in one embodiment, is set to the disengaged mode during deposition process. In one embodiment, a thickness of the wafer 101 received on the pedestal 140 is less than the height 45' of the sidewall 133b of the step. In this embodiment, the height 45' of the sidewall 133b is about 0.79 mm and the thickness of the wafer 101 is about 0.76 mm.

A gap 44 defined between an edge of the wafer 101 and the edge of the silicon carrier ring 133 defined by the step sidewall 133b is designed to be at a minimal so that the plasma is not adversely affected. As noted above, several factors associated with different components of the chamber and plasma-related parameters affect a size of the gap Referring to FIGS. 2A-2C, in one embodiment, the surface of the pedestal 140 has a diameter large enough to receive a wafer 101 that is about 300 mm in diameter and either a silicon ring 132 or a silicon carrier ring 133. In this embodiment, the annular width of the silicon ring 132 or the silicon carrier ring 133 disposed on the pedestal is about 75 mm and the showerhead is about 450 mm in diameter. For instance, the showerhead is at least large enough to overlie the wafer surface and either the silicon ring 132 or the silicon carrier ring 133. Of course, the aforementioned dimensions of the wafer surface, the silicon ring 132 surface or the silicon carrier ring 133 surface and the showerhead 150 are mere examples and should not be considered limiting. For example, in some embodiments, when wafers 101 larger or smaller than 300 mm are processed, the silicon ring 132 or silicon carrier ring 133 is selected and sized so as to increase a sum diameter of the semiconductor wafer 101 and either the silicon ring 132 or the silicon carrier ring 133 to a larger standard size. For example, if a 200 mm wafer is processed, the silicon ring 132 or the silicon carrier ring 133 can extend the combined diameter of the wafer and the silicon ring 132 or silicon carrier ring 133 to 300 mm. In some embodiments, the sizing of the silicon ring 132 or the silicon carrier ring 133 need not extend the combined diameter to a next standard size. Instead, the silicon ring 132 or silicon carrier ring 133 size may be defined to increase the combined diameter by any defined increment, so long as the edge effects are moved off the actual wafer 101 edge and on to the silicon ring 132 or the silicon carrier ring 133.

Figures 1, 3A:
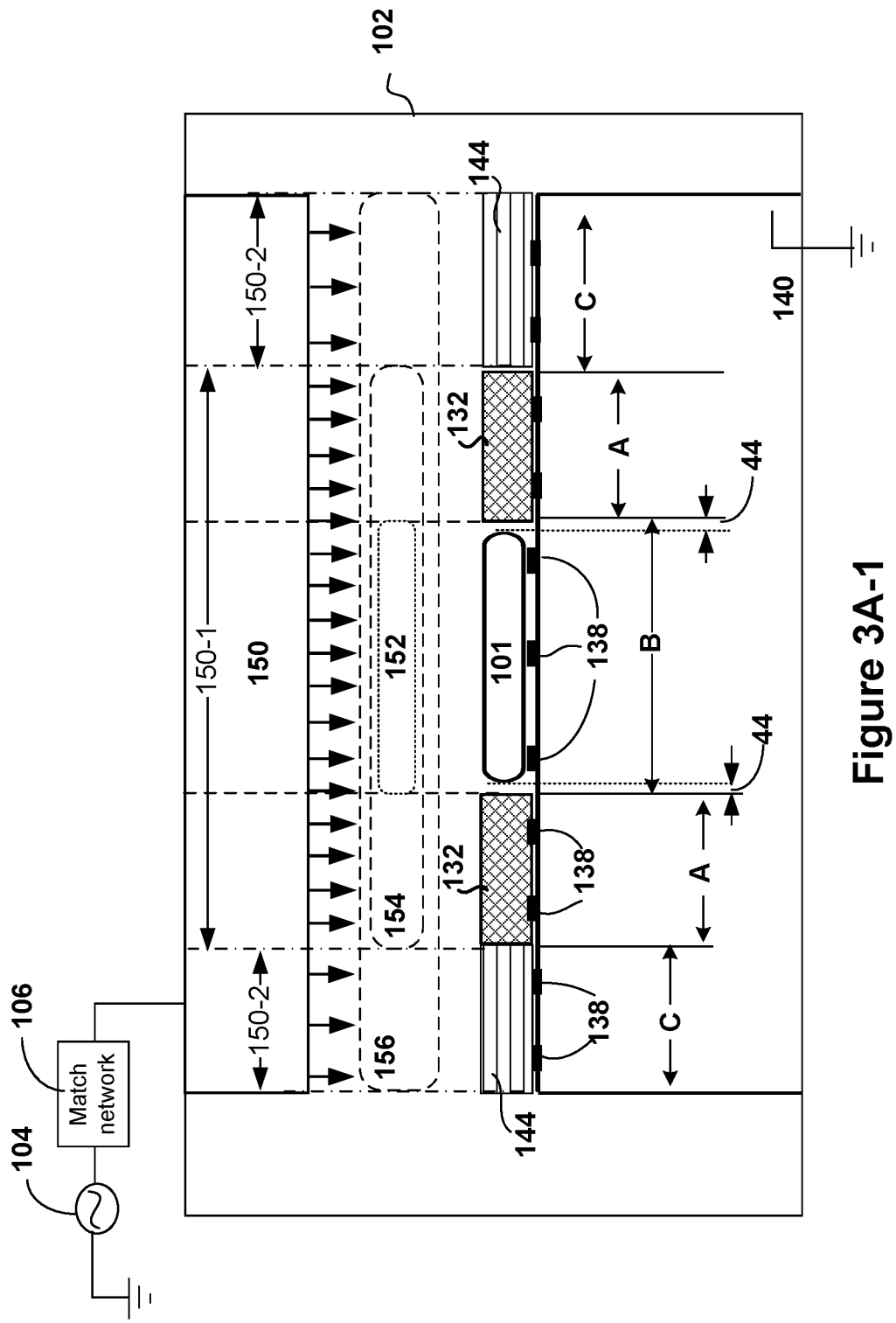

FIG. 3A-1 illustrates a simplified block diagram of a side view of an example pedestal 140 engaged within a deposition system, in one embodiment. The pedestal 140 is designed to receive a semiconductor wafer 101 on a wafer support region (13'), a silicon ring 132 over a carrier support region ('A') and a confinement ring 144 over a confinement region (represented by reference letter 'C'). A plurality of support structures 138 distributed on a top surface of the pedestal 140 define minimal contact areas to receive the wafer 101, the silicon ring 132 and the confinement ring 144. The pedestal 140, in this embodiment, is electrically grounded.

A showerhead 150 is configured to provide process gas to generate a plasma within the chamber 102. The showerhead 150 is designed to cover an area over the pedestal 140 and is connected to a RF power source 104 through a match network 106. The showerhead 150, in one embodiment, includes a central showerhead area 150-1 and an extended showerhead area 150-2. The central showerhead area 150-1 extends over a process zone 152 defined over the wafer 101 and an extended process zone 154 defined over both the wafer 101 and the silicon ring 132. The extended showerhead area 150-2 extends the showerhead to further cover a region defined over the confinement ring 144. A plurality of outlets are defined on a surface of the showerhead 150 facing the pedestal 140 to provide process gas. In one embodiment, the outlets defined over the extended process zone 154 may be disposed to be closer to one another while the outlets in the showerhead defined over the confinement ring region may be spread farther apart. This design may assist in providing a more focused plasma application over the extended process zone 154 while continuing to maintain the plasma over the confinement ring region. In another embodiment, the outlets are evenly distributed in each area encompassing 150-1 and 150-2.

In one embodiment, a height of the confinement ring 144 is designed to be substantially the same as the height of the silicon ring 132 or the carrier wafer 142. In other embodiments, the confinement ring may be thicker or thinner than the silicon ring 132 and the carrier wafer 142, so long as the confinement ring surface is disposed substantially coplanar to the carrier wafer 142 surface and the wafer 101 surface.

Figures 2, 3A:
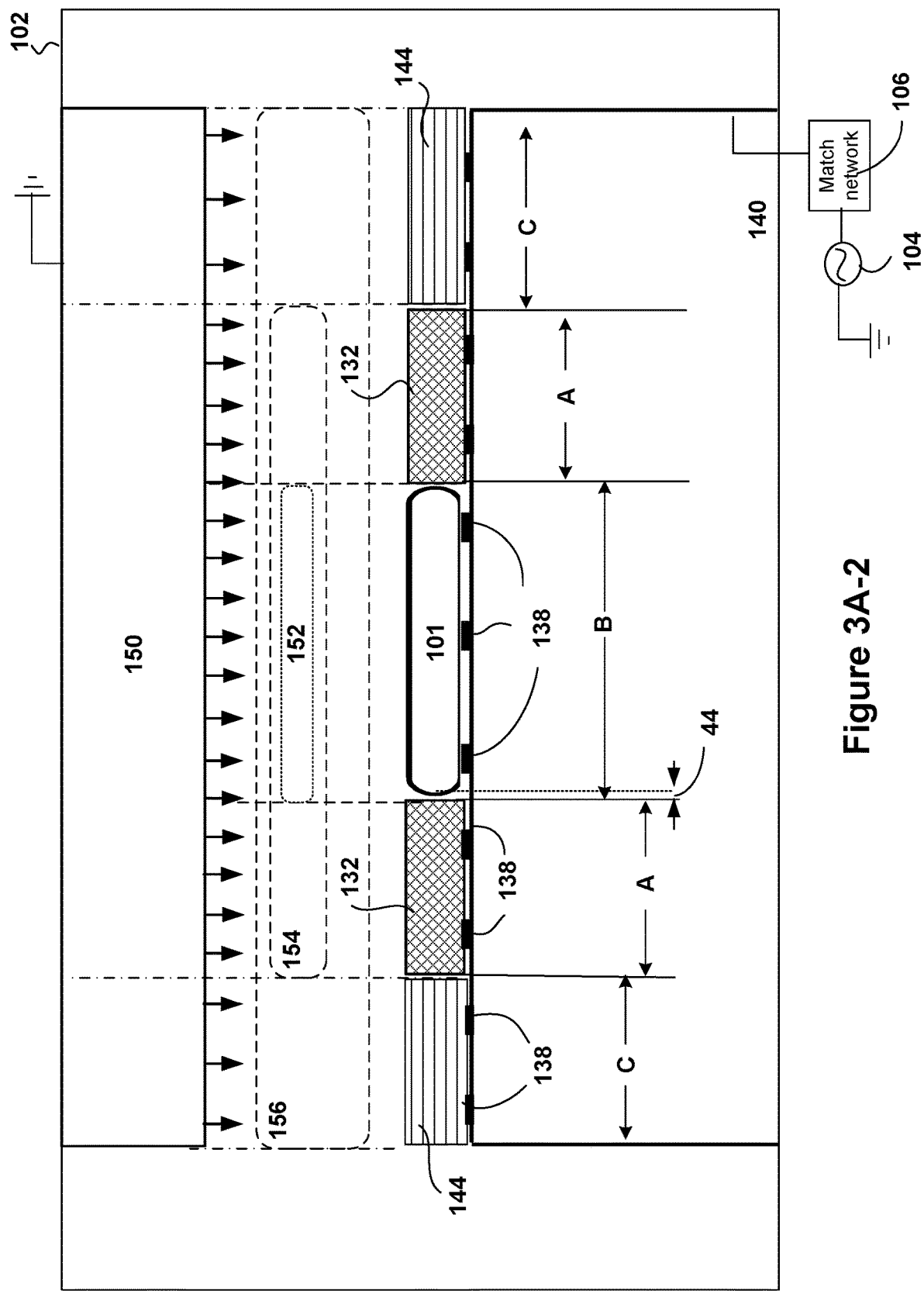

FIG. 3A-2 illustrates a simplified block diagram of a side view of an example pedestal 140 in the deposition system, in an alternate embodiment. The embodiment illustrated in FIG. 3A-2 differs from the embodiment illustrated in FIG. 3A-1 in that the pedestal 140 is connected to the RF power source 104 through a match network 106 and the showerhead 150 is electrically grounded. In the embodiments illustrated in FIGS. 3A-1 and 3A-2, a size of the pedestal 140 is large enough to accommodate the wafer 101, the silicon ring 132 and the confinement ring 144.

FIG. 3B depicts a simplified block diagram of a side view of the pedestal 140 on which a carrier wafer 142 is disposed instead of a silicon ring 132. FIG. 3C illustrates a magnified view of a portion of the carrier wafer 142 identified in FIG. 3B. As illustrated in FIG. 3B, the pedestal 140 is configured to receive a carrier wafer 142 and a confinement ring 144. A top surface of the pedestal 140 includes a plurality of support structures 138 (i.e., MCAs) for receiving and supporting the carrier wafer 142 and the confinement ring 144. The carrier wafer 142 includes an annular ring surface 143 and a pocket 232 defined in the center to receive the wafer 101. The carrier wafer 142 is made of silicon or silicon-like material that exhibits similar electrical properties as the wafer 101. An outer step 136 is defined on the pedestal adjacent to an outer edge of the confinement ring 144. The outer step 136 may include one or more insulator blocks (not shown). The pedestal 140 is connected to a RF power source 104 through a match network 106. The RF power source 104 provides the necessary power to generate the plasma within the chamber 102.

The confinement ring 144, in one embodiment is annular shaped and is designed to encircle the carrier wafer 142. In one embodiment, the confinement ring 144 may be a shadow ring. In some embodiments, the confinement ring may be made of dielectric material or other confining material. In other embodiments, the confinement ring 144 may be made out of materials such as Alumina, Yttria-doped Alumina, Yttria stabilized Zirconia (YSZ), Sapphire, etc.

A showerhead 150 is disposed in the chamber and is designed to be large enough to cover an extended process region 156 that covers the process region 152 defined over the wafer 101, the process region 154 defined over the carrier wafer 142 and the region defined over the confinement ring 144. The showerhead 150, in this embodiment, is electrically grounded. In another embodiment, the showerhead 150 may be powered and the pedestal 140 may be grounded, depending on the desired process and system configuration.

FIG. 3C illustrates the various components of the pocket 232 defined in the center of the carrier wafer 142 that is used to receive the wafer 101. As noted earlier, the carrier wafer 142 includes an annular ring surface 143 surrounding the pocket 232. The pocket 232 is defined by an inner step 242 extending down. The inner step 242 includes a top surface 236 (that corresponds with the annular ring surface 143), a sidewall 234, and a bottom surface 240. A height ($H_{step}$) of the inner step 242 defining the pocket 232, in some embodiments, is equal to or greater than thickness of the wafer 101. In some embodiments, thickness 45" of the bottom surface of the carrier wafer is defined to be about 0.97 mm and the height ($H_{step}$) of the inner step 242 is about 0.79 mm. In some embodiments, the bottom surface 240 of the pocket may include a plurality of support structures 138 for supporting the wafer 101 during deposition process. A height of the support structures 138, in one embodiment, is defined such that when the wafer is disposed over the support structures 138 within the pocket 232, a top surface of the wafer 101 is at about a level as a top surface 236 of the inner step 242 defined in the carrier wafer 142. The annular ring surface 143 extends from an outer edge of the carrier wafer 142 to a top edge 242a of the step.

The geometry and the dimension of the annular ring surface 143 and the pocket 232 allows for a continuation of the deposition surface beyond the wafer edge to the annular ring surface 143 of the carrier wafer 232. The carrier wafer 142 is received on the pedestal 140. In one embodiment, the carrier wafer 142 is made of mono-crystalline silicon. In other embodiments, the carrier wafer 142 is made of silicon-like materials, such as Germanium, ZTA, etc. In one embodiment, a top surface of the pedestal 140 includes a plurality of support structures 138 for receiving the carrier wafer 142 and the confinement ring 144.

In one embodiment, the carrier wafer includes an outside edge 238. An annular shaped confinement ring 144 is disposed on the pedestal 140 so as to surround the carrier wafer 142 such that an inner edge of the confinement ring 144 is adjacent to the outside edge 238 of the carrier wafer 142. A height of the confinement ring 144, in one embodiment, is designed to be of about a same height as the carrier wafer 142 so that a top surface 144a of the confinement ring 144, when present, is approximately coplanar with the annular ring surface 143 of the carrier wafer 142. In other embodiments, as noted above, the confinement ring 144 may be thicker or thinner than the carrier wafer 142 and the confinement ring 144 is disposed so that the surface of the confinement ring 144 is substantially coplanar with the carrier wafer 142 surface. The confinement ring 144 may be made of dielectric material or any other confining material, such as Alumina, etc., and acts to confine or assist in confining the plasma at the outside edge 238 of the carrier wafer 142.

Figure 3D:
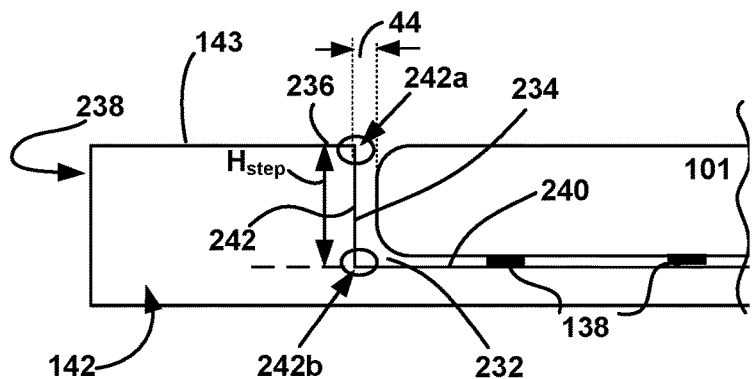
FIGS. 3D-3G illustrate the various configuration of a step defined within the carrier wafer, in various embodiments of the invention.

FIGS. 3D-3G illustrate the various configurations of a step sidewall 234 defined in a pocket 232 of a carrier wafer 142 that is received on a pedestal 140 disposed within a deposition chamber. It should be noted that the various configurations of the step sidewall illustrated in FIGS. 3D-3G are mere examples and that other configuration of the step sidewall may be engaged within the carrier wafer 142. For example, in some embodiments, the sidewall 234 of the inner step 242 may be extended downward in a perpendicular manner, as shown in FIG. 3D. A top edge 242a is defined at an intersection of the sidewall 234 and the top surface 236 of the inner step 242. A bottom edge 242b is defined at the intersection of the sidewall 234 and the bottom surface 240 of the inner step 242. In this example, the edges 242a, 242b may be sharp or machined edges.

A gap 44 is defined between an outer edge of the wafer and the sidewall 234 of the inner step 242. An outside edge 238 of the carrier wafer is adjacent to a confinement ring (not shown) disposed on the pedestal 140 (not shown).

Figure 3E:
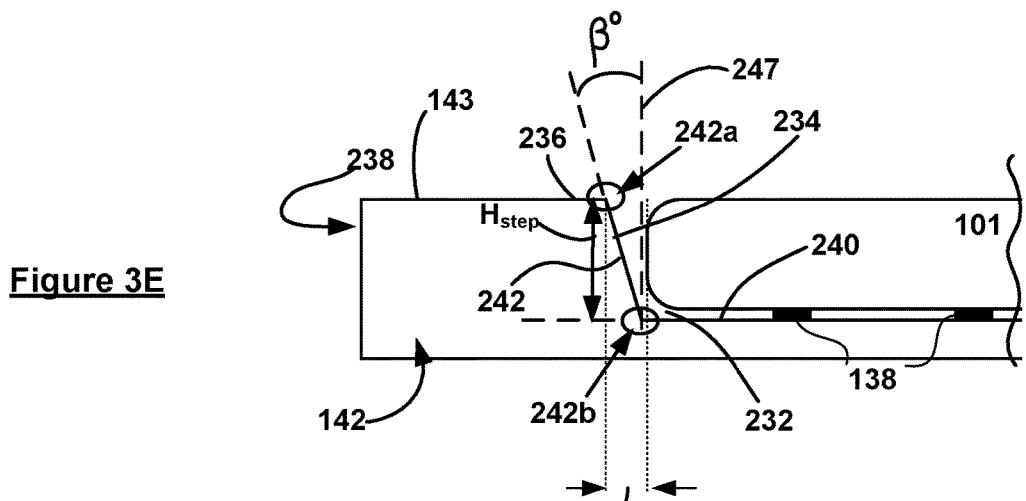

FIG. 3E illustrates a variation of the sidewall 234 of the pocket 232 in another embodiment, wherein the sidewall 234 of the inner step 242 is disposed at an angle 13° that extends outward from the vertical line (represented by the dashed line 247 in FIG. 3E). Similar to the embodiment illustrated in FIG. 3D, the top edge 242a and the bottom edge 242b have sharp or machined edges, although edges 242a, 242b may also be rounded or tapered. In this embodiment, a gap 44a is defined between an outer edge of the wafer and the top edge 242a of the inner step 242.

Figure 3F:
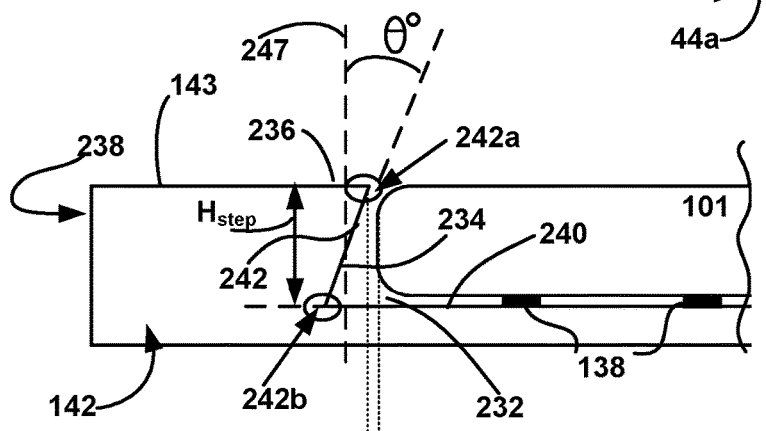

FIG. 3F illustrates another variation of the sidewall 234 of the inner step 242 defining the pocket 232 in yet another embodiment, wherein the sidewall 234 of the pocket 232 is disposed at an angle 0° that extends inward from the vertical line 247 while the top edge 242a and the bottom edge 242b continue to be sharp or machined edges, although these edges (242a, 242b) may be rounded or tapered. In this embodiment, a gap 44b is defined between an outer edge of the wafer and the top edge 242a of the inner step 242.

Figure 3G:
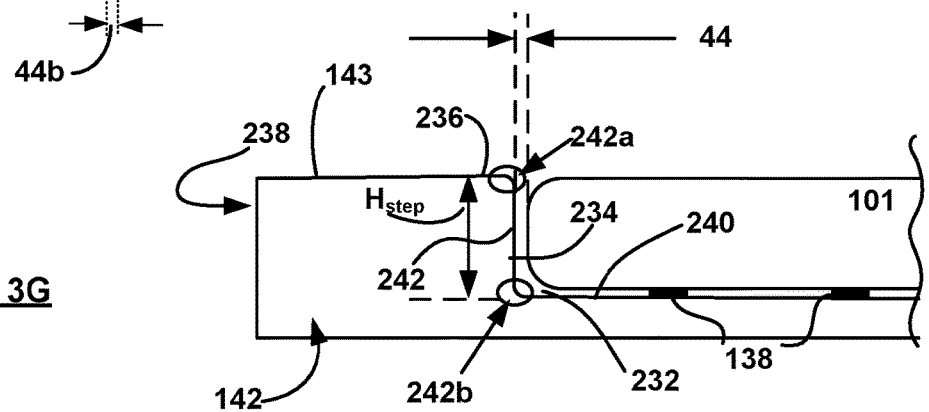

FIG. 3G illustrates a variation of the top edge 242a and the bottom edge 242b of the inner step 242 illustrated in FIGS. 3B-3D. Here, the top edge 242a and the bottom edge 242b of the inner step 242 are rounded. Although both the top and the bottom edges (242a, 242b) are shown to be rounded, variations of this embodiment may include only the top edge 242a being rounded or only the bottom edge 242b being rounded. In this embodiment, a gap 44 is defined between an outer edge of the wafer 101 and the sidewall 234 of the inner step 242. The variations of the sidewall 234 of the inner step 242 defining the pocket 232 of the carrier wafer 142 illustrated in FIGS. 3D-3G are examples and other variations of the sidewall of the inner step 242 may be employed.

As noted in the various embodiments, the plasma generated within the chamber may be extended beyond a wafer edge to a silicon ring edge by, (a) providing a silicon ring (or a silicon carrier ring or a carrier wafer) that is made of silicon or silicon-like material adjacent to the semiconductor wafer on a pedestal (as discussed with reference to the various embodiments); (b) keeping a gap between an outer edge of the semiconductor wafer and an inner edge of the silicon ring (or the step wall of the silicon carrier ring or the carrier wafer) to a minimum to prevent the plasma generated within the chamber from getting adversely affected; (c) extending a showerhead to cover an extended process zone defined over the pedestal that at least includes the semiconductor wafer and the silicon ring (or the silicon carrier ring or the carrier wafer); and optionally (d) providing a confinement ring to surround the silicon ring (or the silicon carrier ring or the carrier wafer). When the confinement ring is present, the showerhead may be extended to cover the area of the pedestal defined over the confinement ring, in addition to covering the area over the semiconductor wafer and the silicon ring (or the silicon carrier ring or the carrier wafer).

The various embodiments thus enable shifting the non-uniformity effects of the deposited film away from the semiconductor wafer edge to the silicon ring edge. The shifting results in the film thickness uniformity at the wafer edge to be substantially comparable to the film thickness uniformity found in other areas of the wafer away from the wafer edge, thereby improving wafer yield.

Figure 4A:
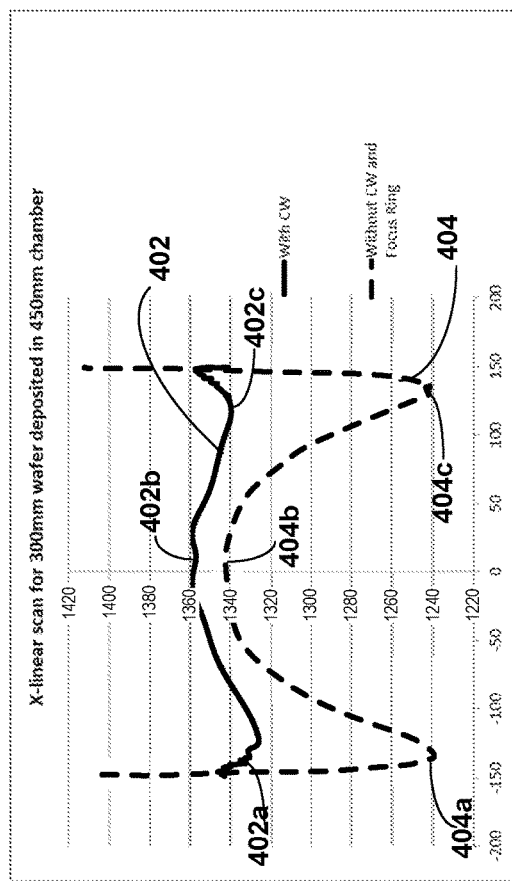
FIGS. 4A and 4B illustrate X and Y-linear scans depicting the wafer-edge uniformity using the chamber configuration illustrated in FIGS. 1-3G, in accordance to one embodiment of the invention.
Figure 4B:
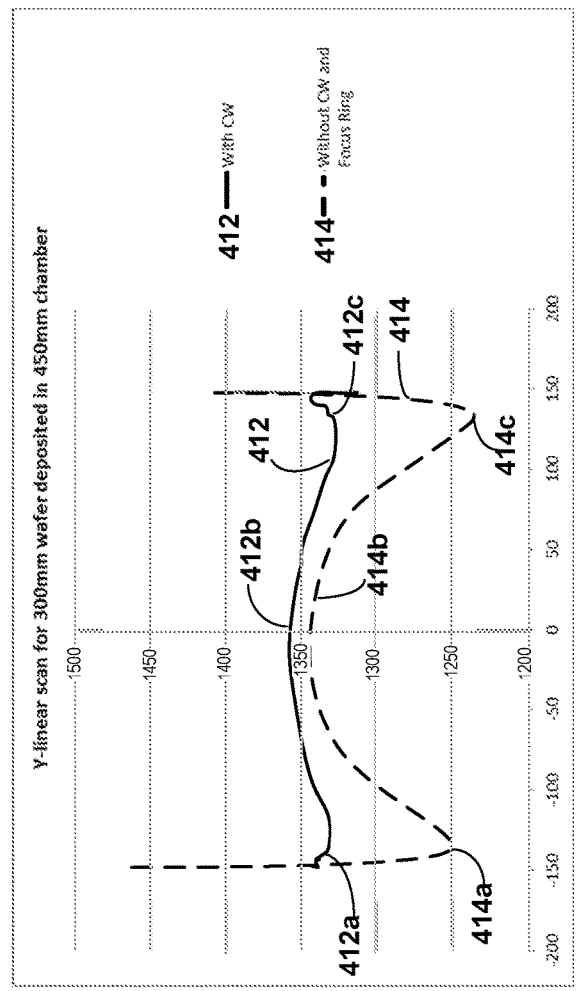

FIGS. 4A and 4B illustrate the X and Y-linear scan graph identifying the effect of a film deposition using the embodiments of the silicon ring or the carrier wafer described herein. FIG. 4A illustrates the X-linear scan 404 plotted for a deposition process that engaged a chamber without a carrier wafer or the silicon ring and the X-linear scan 402 plotted for a deposition process using a chamber that included a carrier wafer. As illustrated in the X-linear scan 404 for the chamber that did not include the carrier wafer or the silicon ring, the edge wings (defined by points 404a, 404c) are more pronounced compared to the middle 404b of the graph. The pronounced edge wings represent the non-uniformity effect at the wafer edge as compared to the middle of the wafer. On the other hand, the X-linear scan 402 plotted for the deposition process that engaged a chamber with an embodiment of a carrier wafer discussed herein, for example, the edge wings (represented by points 402a, 402c) were significantly suppressed and were closer to the middle 402b of the graph. The suppressed edge wings represent substantial improvement in the uniformity of the deposited film at the wafer edge as compared to other areas of the wafer away from the wafer edge (e.g., the middle of the wafer).

As illustrated in FIG. 4B, the Y-linear scan graph 414 plotted for a deposition process that engaged a chamber without carrier wafer or silicon ring showed similar effect with pronounced edge wings (represented by points 414a, 414c) as compared to the middle 414b. This indicates the non-uniformity effect at the wafer edge as compared to the middle of the wafer. Similarly, as can be seen from the Y-linear scan graph 412, for a deposition process that engaged an embodiment of a chamber with carrier wafer discussed herein, the non-uniformity effect at the wafer edge was significantly reduced as can be seen by the suppressed edge wings (represented by points 412a, 412c) compared to the middle 412b in the graph 412.

In one embodiment, the showerhead employed within the chamber was sized to be about 450 mm in diameter and the wafer 101 disposed on the carrier wafer was about 300 mm in diameter. In another embodiment, an outer diameter of the carrier wafer was about 450 mm and an inner diameter of the carrier wafer, defining the pocket for receiving the wafer 101, was about 300 mm. The showerhead, in this embodiment, was sized to cover at least the carrier wafer. In another embodiment, a confinement ring was disposed adjacent to the carrier wafer and the showerhead was sized to overlie the carrier wafer and the confinement ring. As noted earlier, the aforementioned dimensions are just examples and should not be considered limiting. Depending on the diameter of the wafer, the silicon ring is selected and sized so as to increase a sum diameter of the wafer and the silicon ring (or a silicon carrier ring or a carrier wafer) to a larger standard size. In some embodiments, the silicon ring (or a silicon carrier ring or a carrier wafer) may be sized to increase the sum diameter of the wafer and the silicon ring (or a silicon carrier ring or a carrier wafer) by any defined increment that allows the edge effects to move away from the wafer edge to the edge of the silicon ring (or a silicon carrier ring or a carrier wafer). The embodiments described herein allow separation of the plasma confinement from the wafer edge so as to substantially improve film thickness uniformity at the wafer edge to be as uniform as on the wafer away from the wafer edge.

The control module 110 illustrated in FIG. 1 is used to manage the generation of the plasma and maintenance of the deposition conditions within the chamber. For instance, the control module 110 may be used to control the processing parameters of the deposition chamber to generate the plasma used in the deposition process. The control module 110 may include a processor, memory and one or more interfaces. The control module 110 may, in some embodiments, be employed to control one or more devices in the system 100 based in part on sensed values. For example, the control module 110 may be used to control one or more of valves, filter heaters, pumps, and other devices that are integrated in the system 100 based on the sensed values and other control parameters. The control module receives the sensed values through various sensors disposed throughout the chamber 102, such as pressure manometers, flow meters, temperature sensors, and/or other sensors. The control module may also be employed to control process conditions during delivery and deposition of the film. The control module will typically include one or more memory devices and one or more processors.

The control module may control activities of the delivery system and deposition apparatus. The control module executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, gap between the electrodes (upper and lower) and other parameters of a particular process. The control module may also monitor the pressure differential and automatically switch vapor delivery from a first path(s) to a second path(s). Other computer programs stored on memory devices associated with the control module may be employed in some embodiments.

Typically there will be a user interface associated with the control module. The user interface may include a display (e.g. a display screen and/or graphical software displays of the apparatus and/or process conditions), and user input devices such as pointing devices, keyboards, touch screens, microphones, etc.

Computer programs for controlling delivery of deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include wafer positioning code, process gas control code, pressure control code, heater control code, and plasma control code.

A wafer positioning program may include program code for controlling chamber components that are used to load the wafer onto a pedestal or chuck and to control the spacing between the wafer and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the delivery system, the wafer and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers, and thermocouples located in delivery system, the pedestal or chuck (e.g. the temperature sensors). Appropriately programmed feedback and control algorithms may be used with data from these sensors to maintain desired process conditions. The foregoing describes implementation of embodiments of the invention in a single or multi-chamber semiconductor processing tool.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A chamber for processing a semiconductor wafer of diameter D and thickness T, the processing of the semiconductor wafer including performing deposition of a material over a surface of the semiconductor wafer, the chamber comprising:
   a carrier wafer including an annular ring surface and a pocket, the pocket being defined in a center of the carrier wafer and including a step, the annular ring surface being defined to surround the pocket and extend from a top edge of the step to an outer edge of the carrier wafer, the step including a top surface that corresponds to the annular ring surface, a bottom surface that corresponds to a top surface of the pocket, and a sidewall that extends between the top surface and the bottom surface of the step, wherein the top surface of the pocket extends across a circular region bounded by the sidewall and provides a support surface for receiving the semiconductor wafer, a diameter of the pocket is sized larger than D, a normal distance between the annular ring surface and the top surface of the pocket approximates T, the annular ring surface of the carrier wafer extends a process zone that is defined over the semiconductor wafer, when present, to an extended process zone that is defined over the semiconductor wafer, when present, and the annular ring surface of the carrier wafer, and the carrier wafer is a single, contiguous structure;
   a pedestal configured to receive and support the carrier wafer;
   a confinement ring surrounding the carrier wafer and disposed on the pedestal; and
   a showerhead having a plurality of outlets configured to provide process gas to the surface of the semiconductor wafer during processing of the semiconductor wafer and while the semiconductor wafer is received in the pocket, the plurality of outlets including a first set of outlets defined over a central showerhead area and a second set of outlets defined over an extended showerhead area, the central showerhead area being substantially disposed over the carrier wafer and the extended showerhead area being substantially disposed over the confinement ring, wherein the first set of outlets is disposed adjacent to the second set of outlets such that plasma formed by the process gas supplied by the first set of outlets and the second set of outlets is contiguous.

2. The chamber of claim 1, wherein the first set of outlets is distributed uniformly over the extended process zone and the outlets in the first set of outlets are spaced apart from one another by a first distance, and the second set of outlets is distributed uniformly over the confinement ring and the outlets in the second set of outlets are spaced apart from one another by a second distance.

3. The chamber of claim 2, wherein the first distance is less than the second distance.

4. The chamber of claim 2, wherein the first distance is equal to the second distance.

5. The chamber of claim 1, wherein the confinement ring is defined from a dielectric material.

6. The chamber of claim 1, wherein the diameter of the pocket is about 300 mm, and a diameter of the outer edge of the carrier wafer is about 450 mm.

7. The chamber of claim 1, wherein the carrier wafer extends the semiconductor wafer to a second standard diameter larger than D.

8. The chamber of claim 1, wherein a radial width of the annular ring surface of the carrier wafer is about 75 mm.

9. The chamber of claim 1, wherein the normal distance between the annular ring surface and the top surface of the pocket is between about 0.75 mm and about 0.85 mm.

10. The chamber of claim 1, wherein a thickness of the carrier wafer within the the pocket is between about 0.9 mm and about 1 mm.

11. The chamber of claim 1, wherein a top surface of the pedestal includes a first region with first minimum contact areas (MCAs) for supporting the carrier wafer and a second region with second MCAs for supporting the confinement ring.

12. The chamber of claim 1, wherein the top surface of the pocket includes minimum contact areas (MCAs) for supporting the semiconductor wafer, when present.

13. The chamber of claim 1, wherein the pedestal is connected to a radio frequency (RF) power source through a match network and the showerhead is electrically grounded, the RF power source configured to provide power to generate plasma within the chamber.

14. The chamber of claim 1, wherein the showerhead is connected to a radio frequency (RF) power source through a match network and the pedestal is electrically grounded, the RF power source configured to provide power to generate plasma within the chamber.

15. The chamber of claim 1, wherein a radial gap of between about 0.25 mm and 1.0 mm is defined between an outer edge of the semiconductor wafer, when present, and the sidewall.

16. The chamber of claim 1, wherein a top surface of the confinement ring is coplanar with the annular ring surface of the carrier wafer.

17. The chamber of claim 1, wherein the carrier wafer is a moveable unit that can be moved into and out of the chamber while supporting the semiconductor wafer.

* * * * *